INVENTOR
ROYDEN R. FREELAND

BY Stevens, Davis, Miller & Mosher
ATTORNEYS.

INVENTOR
ROYDEN R. FREELAND

BY Stevens, Davis, Miller & Mosher
ATTORNEYS.

INVENTOR
ROYDEN R. FREELAND

BY Stevens, Davis, Miller & Mosher
ATTORNEYS.

United States Patent Office 3,421,110
Patented Jan. 7, 1969

3,421,110

TEMPERATURE COMPENSATED AND TRIM CONTROLLED CRYSTAL OSCILLATOR CIRCUIT

Royden R. Freeland, Oklahoma City, Okla., assignor to International Crystal Manufacturing Co., Inc., Oklahoma City, Okla., a corporation of Oklahoma Filed May 22, 1967, Ser. No. 639,969
U.S. Cl. 331—116 8 Claims
Int. Cl. H03b *5/30;* H03b *5/36;* H03b *3/02*

ABSTRACT OF THE DISCLOSURE

A crystal oscillator circuit including a thermistor in signal series with the crystal oscillator for imparting temperature compensation and a variable capacitor in the series with the crystal oscillator to provide trim control. A variable differential capacitor with one plate in series with the thermistor controls the amount of temperature compensation imparted by the network. An amplifier stage is provided with a capacitive feed-back network the value of which sets the fundamental or overtone mode for the crystal. With the trim capacitor in series with the crystal, the operating range for the circuit is improved by permitting larger values of capacitors in the feed-back circuit.

BACKGROUND

The state of the art in crystal processing has become such that grinding tolerances can be held to about ¼ minute of angle. The temperature curve of the crystal blank is directly related to the sawing-grinding angle plus any shift in this angle through processing. In general, for best wide-range temperature characteristics, the crystal should have a maximum frequency turning point around 10° C. and a minimum turning point around 60° C. The percentage frequency change between these turning points sets the error over this range. The frequency will rise sharply above the upper TP (turning point) and decrease sharply below the lower TP.

Present industry calls for operation over the range −30° to +60° C. It is below the lower TP that it becomes necessary to temperature compensate the curve to keep it from falling below tolerance.

Therefore, crystal oscillator circuits expected to operate in the stated temperature range must provide adjustment of the compensation to the crystal since as a practical matter, the selected angle will not be exact but instead will be within the above-mentioned tolerance. The selected angle varies with end frequency of the crystal unit. In addition to temperature compensation, the circuit must provide frequency adjustment or trimming to zero channel.

It is currently conventional to design the trim and temperature networks in parallel with the crystal, but this conventional design had not been free from undesirable interaction between the effects of the trim and the temperature compensation adjustments. Specifically, with the conventional arrangement, temperature compensation is reduced as the trimmer is operated to a maximum value and, on the other hand, temperature compensation increases as the trimmer network is adjusted toward minimum value. Furthermore, the size of the compensation capacitor is limited since it will unduly reduce the trimmer range if made too large. Therefore, the search continues for better ways to reduce the interdependence upon the stated two types of adjustments.

The present invention provides a new and improved crystal oscillator circuit which avoids the above problems and achieves improved operation. Stated briefly, the circuit of the invention includes the temperature compensation and trim networks in series with the crystal so that the effective operating point is kept at a low capacitive value by adjusting the trimmer value. With this arrangement, the compensation can be made as large as desirable or required since the operating point is primarily set by the trimmer network. In addition, the large capacitive load of the oscillator looks small to the crystal by virtue of the series configuration. Operating at a light load capacitance point provides maximum trim effect with little change in compensation effect. Thus, the circuit according to the invention achieves substantially independent trim and temperature compensation for the circuit at the critical low temperature operating range.

It is therefore an object of the present invention to provide a crystal oscillator circuit which avoids the problems and achieves the advantages as outlined above.

DESCRIPTION OF THE DRAWINGS

Other and further objects of the invention will become apparent with the following detailed description when taken in view of the appended drawings in which.

DETAILED DESCRIPTION OF EMBODIMENTS

Figures 1, 2:
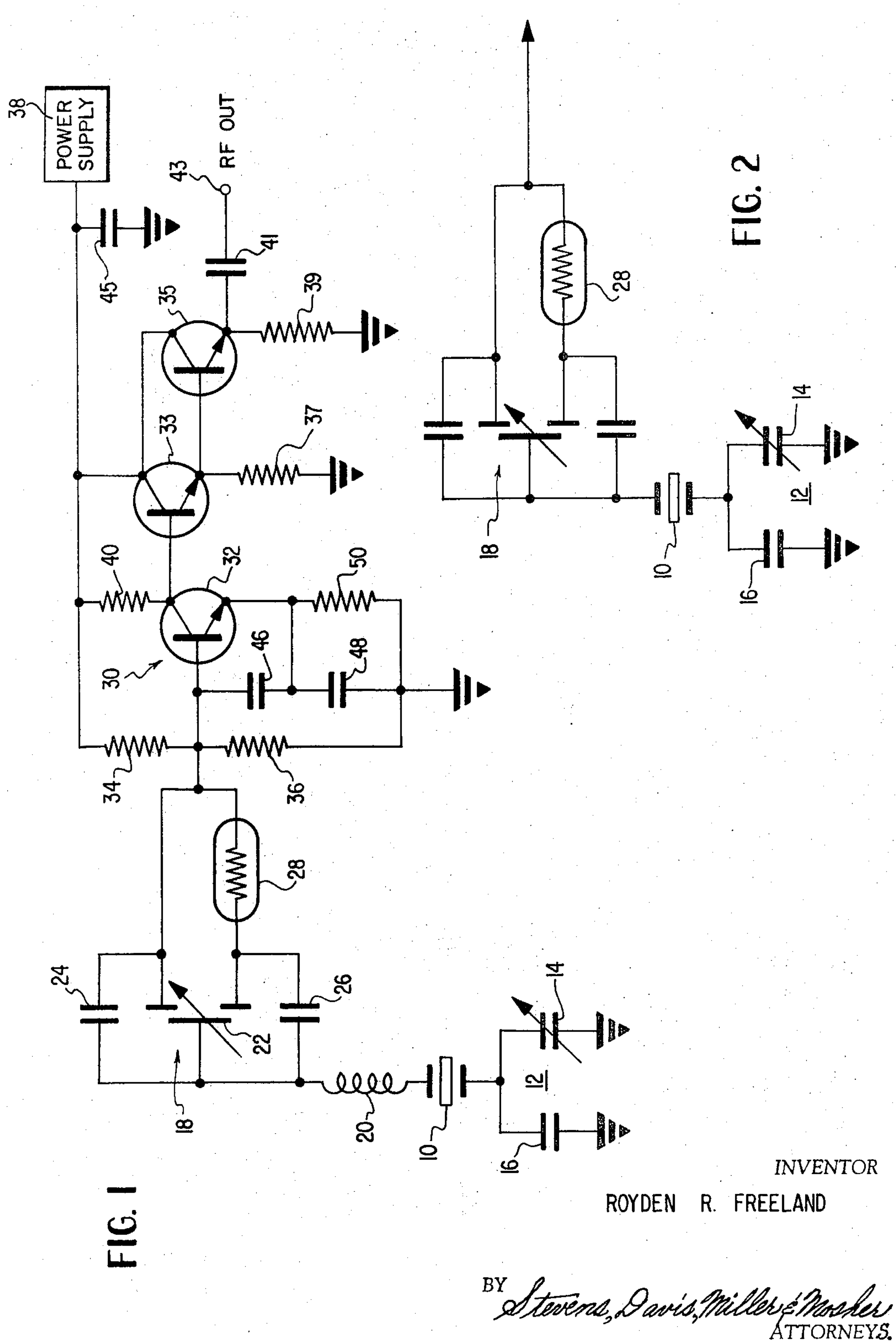
FIGURE 1 is a schematic diagram of one embodiment of the invention.
FIGURE 2 is a schematic diagram of the crystal stage of an alternate embodiment of the invention.

With reference to FIGURE 1, there is illustrated a circuit according to the invention. Crystal 10 is connected in series with the adjustable trim network 12 including variable capacitor 14 connected between the crystal and ground. An input capacitor 16 is connected in shunt with capacitor 14 and sets the minimum capacitance of the circuit and thus the average load capacitance presented to the crystal.

Figure 4:
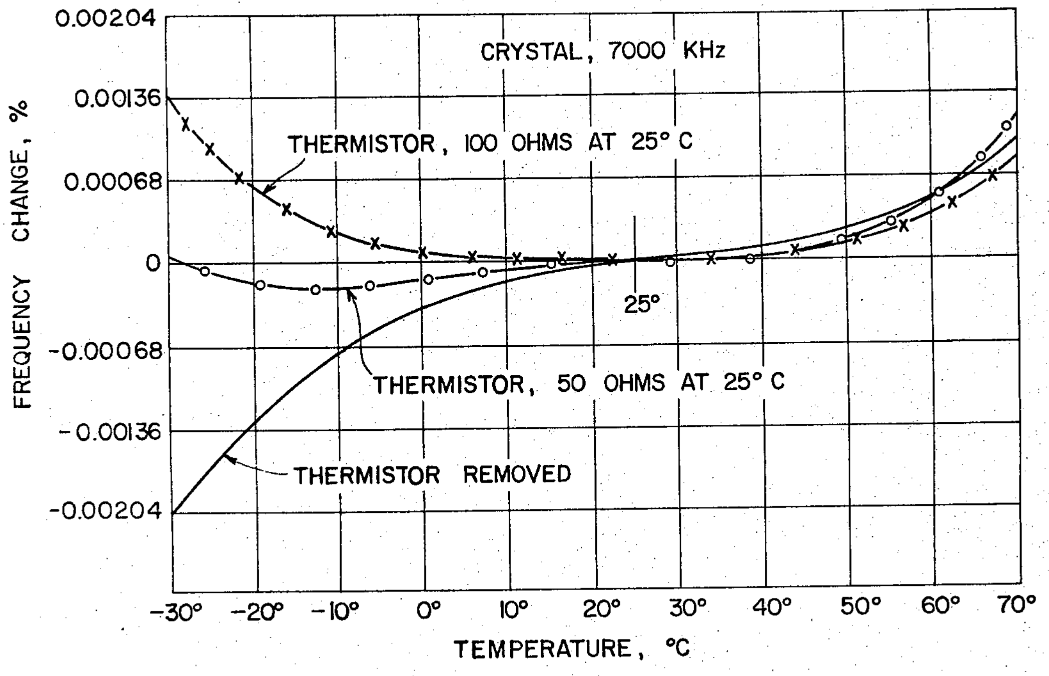

The output side of crystal 10 is coupled to the temperature compensating network generally indicated as 18 by a series inductor 20. Inductor 20 may be used at the higher frequencies in order to increase the frequency trim range for zero adjustment of the crystal. The variable differential capacitor 22 and capacitors 24 and 26 together with thermistor 28 connected generally as shown form the variable temperature compensating network 18. By adjustment of capacitor 22, this network 18 varies the load capacitance to the crystal 10 slightly to alter the temperature characteristics of the crystal and thus extend the temperature over which the crystal maintains a given temperature tolerance. Thus, by virtue of the adjustability of capacitor 22, the amount of compensation can be readily adjusted to the crystal since the crystal curves vary slightly due to inherent variations in the processing of the crystal as described above. By selecting the value of thermistor 28, network 18 can be made to effect the cold end of the curve and have very little effect from room temperatures to the hot end point. See FIGURE 4.

The output of network 18 is applied to the input of the amplifier stage (oscillator) generally indicated as 30 which may be transistorized or tube type. One example of the amplifier stage includes NPN transistor 32 having its base biased by the voltage dividing arrangement formed by resistor 34 and resistor 36 respectively coupled to the power supply 38 and ground. The load or collector resistor 40 is also connected to power supply 38. Capacitor 45 in shunt with power supply 38 filters voltage transients on line 47. A pair of series capacitors 46 and 48 are connected from the base of transistor 32 to ground and cooperate with resistor 50 connected to the emitter of transistor 32 and in parallel with capacitor 48 to form a feed-back network from the emitter to the base of transistor 32. The impedances of capacitors 46 and 48 set the pass band and thus the general range in which the crystal 10 controls the oscillation of the amplifier stage 30. Resistor 50 develops DC emitter bias such that in the static condition the emitter is slightly less negative than the collector and sufficiently negative relative to the base so that transistor 32 is not driven to cut-off. Resistor 50 also develops the alternating voltage for the feed-back circuit to the base of transistor 32. Stage 30 causes crystal 10 to oscillate in its fundamental mode or in the third or fifth mechanical overtone modes, depending upon the values of capacitors 46 and 48. The substantial total load capacitance presented to crystal 10 is set by capacitors 46 and 48, capacitors in the compensating network 18, capacitors 14 and 16, inductor 20 and the input capacitance of transistor 32.

By providing the compensation network 18 and trim control capacitor 14 in series with crystal 10, the values of capacitors 46 and 48 can be made larger than in the conventional case where the trim and compensating networks are in parallel with the crystal. Thus, with larger capacitors 46 and 48, the effect of input capacitance variations of transistor 32 is greatly limited.

Transistors 33 and 35 with emitter resistors 37 and 39, arranged generally as shown, receive the signal from transistor 32, increase the power content thereof and apply the output signal through a blocking capacitor 41 to the circuit output terminal 43. Transistors 32, 33 and 35 preferably form part of the circuit commonly identified in the art as RCA 3018.

Figure 3:
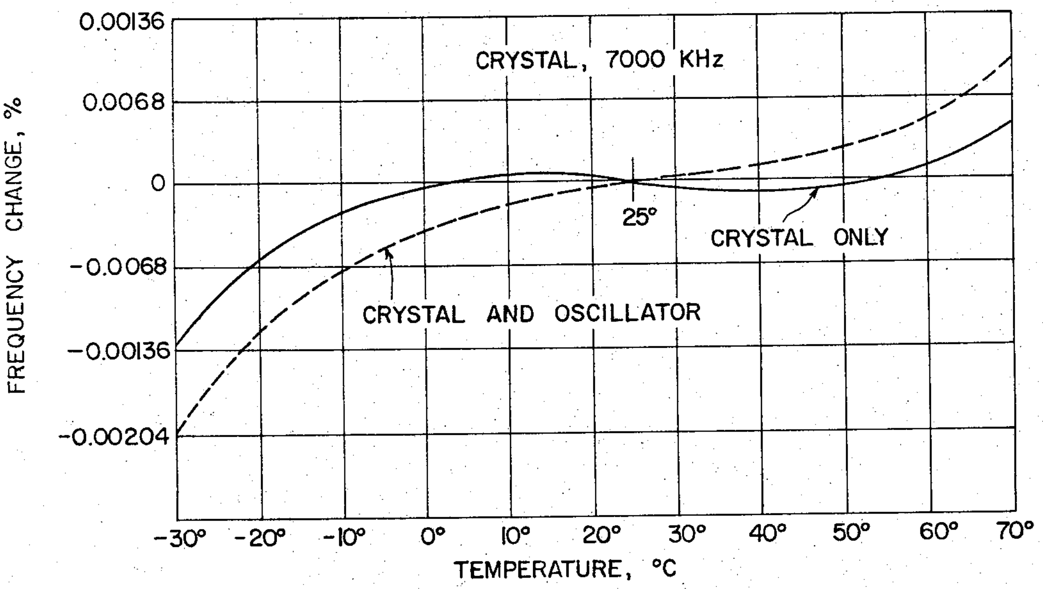
FIGURES 3–6 are graphic illustrations of the operational characteristics of the invention for the case of a 7,000 kHz. crystal. All curves are referenced at 25° C.
Figure 5:
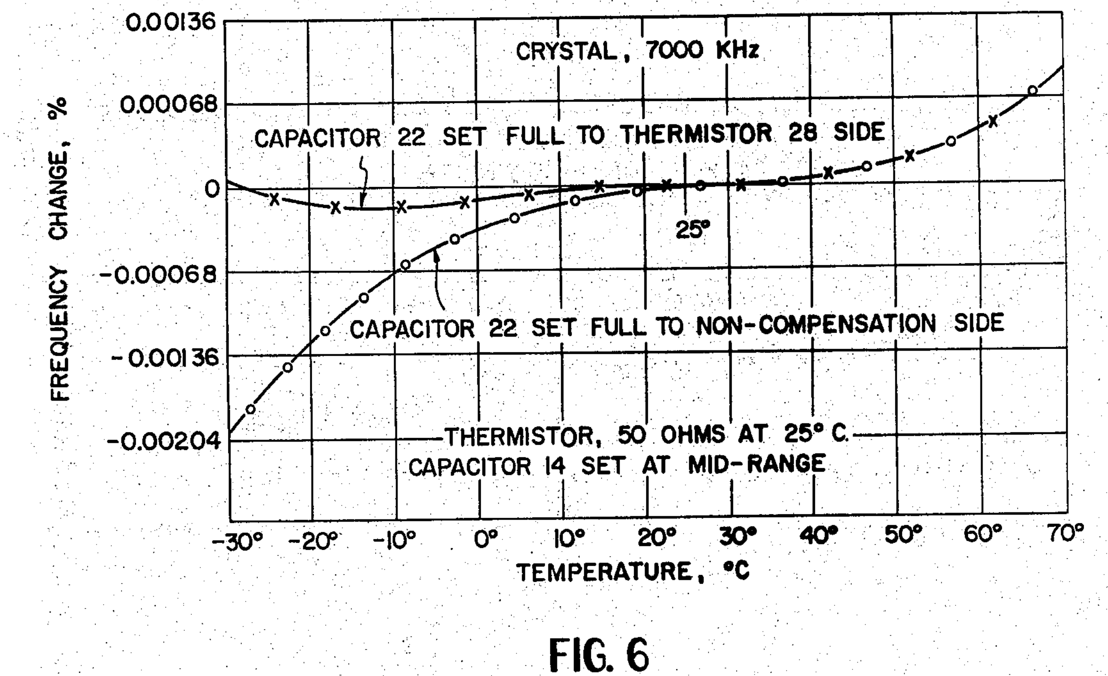
Figure 6:
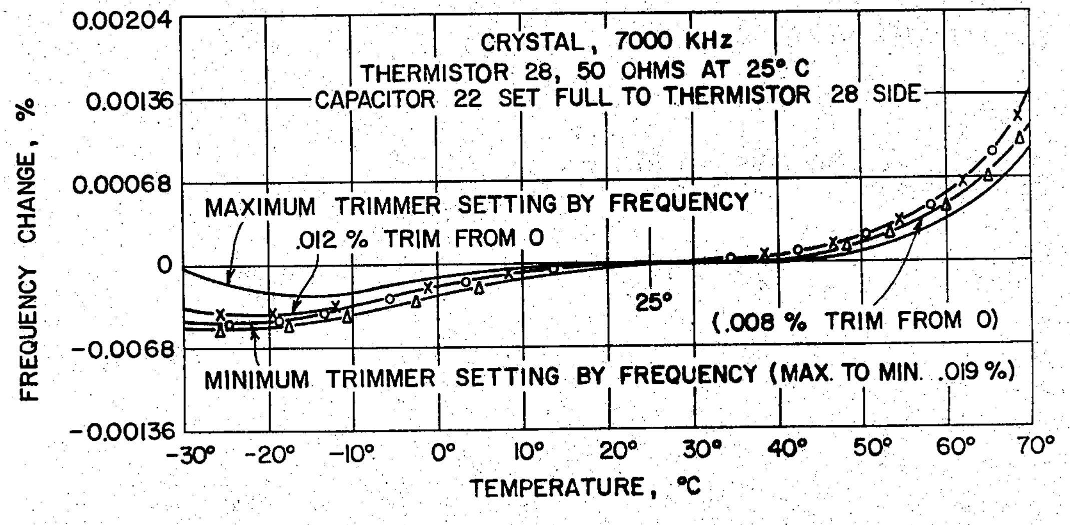

In operation, it is preferred that the oscillator circuit according to the invention be used in the 70 kHz. to 65 mHz. crystal range. As mentioned above, the oscillators include variable temperature compensation for the crystal characteristics so as to produce a crystal controlled signal over a wide temperature range with close tolerance. For illustration, compare the curves of FIGURES 3 and 4. Specifically, the thermistor 28 controls the operating crystal characteristics in accordance with temperature variations and differential capacitor 22 in the compensation network 18 keeps the effective capacitance, i.e., the capacitance the crystal sees, at the cold end of the temperature range the same so that adjustment thereof has minimum effect on the room temperature setting of the frequency trimmer capacitor 14. In this way, the functions of thermistor 28 and capacitor 14 are kept independent of each other. Compare the low temperature ranges of FIGURES 5 and 6.

For calibration, the oscillating frequency is set at a room temperature using the trimmer capacitor 14. Then, the entire oscillator and crystal are cooled to the low end of the operating temperature and capacitor 22 is set so that the frequency is within the low tolerance. Following this setting, the oscillator circuit will provide reliable signal generation regardless of temperature within the prescribed range.

In FIGURE 2 there is illustrated the crystal stage of an alternate embodiment of the invention in which the output of crystal 10 is connected directly to compensating network 18. The remainder of the circuit (not shown) may be the same as in FIGURE 1. In operation, this alternate embodiment operates crystal 10 on its third and fifth mechanical overtones to 65 mHz. The adjustable trim and compensating networks operate the same and with the same advantages as described above.

Values of circuit components for one example of FIGURE 2 are as follows:

| | |
|---|---|
| Crystal | 7,000 kHz. |
| Power Supply 38 | +6 v. DC. |
| Capacitors: | |
| 14 | 1–8 pf. |
| 16 | 12 pf. |
| 22 | 2–13 pf. (each side). |
| 24 | 5–75 pf. (preferably 10 pf.). |
| 26 | 5–75 pf. (preferably 5 pf.). |
| 41 | 0.001 mf. |
| 45 | 0.01 mf. |
| 46 | 25–300 pf. (preferably 200 pf.). |
| 48 | 5–200 pf. (preferably 150 pf.). |
| Resistors: | |
| 34 | 6.8K. |
| 36 | 3.3K. |
| 37 | 3.3K. |
| 39 | 2.2K. |
| 40 | 1.5K. |
| 50 | 1.0K. |
| Thermistors | 10–100 ohms at 25° C. |
| Transistors: | |
| 32, 33, 35 | Part of RCA 3018. |

It should be understood that other and further modifications can be made of the herein disclosed examples of the invention without departing from the spirit and scope thereof.

What is claimed is:

1. In a crystal oscillator circuit, a crystal trim control means coupled in series with the crystal and being adjustable to set the effective operating point for the crystal, temperature compensating means coupled in series with the crystal and trim control means for sensing the temperature changes and compensating the circuit operation accordingly so as to enhance the circuit frequency operational stability, said temperature compensating means comprising a network including adjustable capacitive means to set the amount of temperature compensation provided by the network and a thermistor, the value of which determines the temperature range most compensated by the network, an amplifier stage including means for causing the amplifier stage to oscillate, said stage having input and output terminals, said temperature compensating means, crystal, and trim control means being coupled from the common to the amplifier stage input terminal for controlling the oscillating frequency thereof in accordance with the crystal frequency.

2. In an oscillating circuit as set forth in claim 1 wherein the amplifier stage includes capacitive means to determine the pass band for the amplifier stage oscillating frequency and arranged to affect the input capacitance for the amplifier stage and thus the mechanical fundamental and overtone mode of the crystal oscillation.

3. In an oscillator circuit as set forth in claim 2 wherein the trim control means includes a variable capacitor, and a fixed capacitor connected in parallel therewith to set the average load capacitance for the crystal.

4. In an oscillating circuit as set forth in claim 4 wherein said adjustable capacitance means includes a variable differential capacitor having one plate coupled to the crystal, a second plate coupled to the amplifier input, and a third plate, the thermistor being coupled from the third plate to the amplifier input.

5. In an oscillating circuit as set forth in claim 1 wherein said amplifier stage includes an amplifier with an input control electrode and an output electrode and a third electrode, said means causing oscillation comprising a feed back network connected from said third electrode to said control electrode and including capacitive impedance elements to set the pass band and affect the operating mechanical vibrating mode for the crystal.

6. In an oscillating circuit as set forth in claim 1 wherein the temperature compensating means, crystal, and trim control means are directly connected in series and to the amplifier stage input terminal.

7. In an oscillating circuit as set forth in claim 1 wherein an inductive means is coupled to the temperature compensating means, crystal, and trim control means arrangement to increase at high frequencies the frequency trim range for zero adjustment of the crystal.

8. A crystal oscillator circuit comprising a crystal, a variable trim control capacitor connected from one crystal terminal to common, a first fixed capacitor connected in parallel with said trim capacitor to set the average load capacitance for the crystal, an amplifier stage including a three electrode amplifier element, a power supply, a load resistor connected from the output electrode to the power supply, a bias resistance coupled from the power supply to the control electrode to common, a feed back network coupled from the third electrode to the control electrode and including a resistor connected from the third electrode to common, a second capacitor connected from the third electrode to the control electrode and a third capacitor connected in parallel with said resistor, and a temperature compensating network connected in series from the other crystal terminal to said control electrode, said network comprising a variable differential capacitor having one plate coupled to said other crystal terminal, a second plate connected to said control electrode, and an additional plate, a thermistor connected from the additional plate to said control electrode, a fourth capacitor connected in parallel with said first and second plates, and a fifth capacitor connected in parallel with said first and additional plates.

References Cited

FOREIGN PATENTS

| | | |
|---|---|---|
| 1,060,922 | 7/1959 | Germany. |
| 811,095 | 4/1959 | Great Britain. |

ROY LAKE, *Primary Examiner.*

SIEGFRIED H. GRIMM, *Assistant Examiner.*

U.S. Cl. X.R.

331—66, 109, 176